United States Patent
Chen

(10) Patent No.: US 6,579,742 B2
(45) Date of Patent: *Jun. 17, 2003

(54) FABRICATION OF MOLECULAR ELECTRONIC CIRCUIT BY IMPRINTING

(75) Inventor: Yong Chen, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 22 days.

This patent is subject to a terminal disclaimer.

(21) Appl. No.: 09/964,986

(22) Filed: Sep. 26, 2001

(65) Prior Publication Data

US 2003/0003775 A1 Jan. 2, 2003

Related U.S. Application Data

(63) Continuation of application No. 09/895,601, filed on Jun. 28, 2001, now Pat. No. 6,432,740.

(51) Int. Cl.[7] .................. H01L 51/40; H01L 21/311
(52) U.S. Cl. ............................ 438/99; 438/703
(58) Field of Search .................... 438/99, 691, 700, 438/735, 703, DIG. 935, DIG. 947, DIG. 949; 365/151, 153, 158, 128, 171; 369/101, 176

(56) References Cited

U.S. PATENT DOCUMENTS

| | | | |
|---|---|---|---|
| 5,772,905 A | 6/1998 | Chou | 216/44 |
| 6,128,214 A | 10/2000 | Kuekes et al. | 365/515 |
| 6,159,620 A | 12/2000 | Heath et al. | 428/615 |

OTHER PUBLICATIONS

USSN 09/280,048, "Chemically Synthesized and Assembled Electronic Devices", Filed Mar. 29, 1999.
USSN 09/280,225, "Molecular Wire Crossbar Interconnect (MWCI) for Signal Routing and Communications", filed Mar. 29, 1999.
USSN 09/280,045, "Molecular Wire Crossbar Logic (MWCL)", filed Mar. 29, 1999.
USSN 09/280,188, "Molecular Wire Transistor (MWT)", filed Mar. 29, 1999.
USSN 09/823,195, "Bistable Molecular Mechanical Devices With A Band Gap Change Activated By an Electric Field For Electronic Switching, Gating, And Memory Applications", filed Mar. 29, 2001.
C.P. Collier et al, "Electronically Configurable Molecular––Based Logic Gates", Science, vol. 285, pp. 391–394, (Jul. 16, 1999).
C.P. Collier et al, "A [2]Catenane–Based Solid State Electronically Reconfigurable Switch", Science, vol. 289, pp. 1172–1175 (Aug. 18, 2000).
S.Y. Chou et al, "Imprint Lithography with 25–Nanometer Resolution", Science, vol. 272, pp. 85–87 (Apr. 5, 1996).

*Primary Examiner*—Evan Pert

(57) ABSTRACT

A method of fabricating a molecular electronic device or crossbar memory device is provided. The device comprises at least one pair of crossed wires and a molecular switch film therebetween. The method comprises: (a) forming at least one bottom electrode on a substrate by first forming a first layer on the substrate and patterning the first layer to form the bottom electrode by an imprinting technique; (b) forming the molecular switch film on top of the bottom electrode; (c) optionally forming a protective layer on top of the molecular switch film to avoid damage thereto during further processing; (d) coating a polymer layer on top of the protective layer and patterned the polymer layer by the imprinting method to form openings that expose portions of the protective layer; and (e) forming at least one top electrode on the protective layer through the openings in the polymer layer by first forming a second layer on the polymer layer and patterning the second layer. The imprinting method can be used to fabricate nanoscale patterns over a large area at high speeds acceptable in industrial standards. Consequently, it can be used to fabricate nanoscale molecular devices, e.g., crossbar memory circuits.

20 Claims, 3 Drawing Sheets

FABRICATION OF MOLECULAR ELECTRONIC CIRCUIT BY IMPRINTING

This application is a continuation of application Ser. No. 09/895,601, filed Jun. 28, 2001, now U.S. Pat. No. 6,432,740.

CROSS-REFERENCE TO RELATED APPLICATIONS

The present application is related to application Ser. No. 09/280,048, entitled "Chemically Synthesized and Assembled Electronic Devices", filed on Mar. 29, 1999, which is directed to the formation of nanowires used for nanoscale computing and memory circuits. The present application is also related to applications Ser. No. 09/280,225, entitled "Molecular Wire Crossbar Interconnect (MWCI) for Signal Routing and Communications", Ser. No. 09/280,045, entitled "Molecular Wire Crossbar Logic (MWCL)", and Ser. No. 09/280,188, entitled "Molecular Wire Transistor (MWT)", all also filed on Mar. 29, 1999, and to U.S. Pat. No. 6,128,214, entitled "Molecular Wire Crossbar Memory", issued on Oct. 3, 2000, which are all directed to various aspects of memory and logic circuits utilized in nanocomputing. The present application is also related to application Ser. No. 09/823,195, filed Mar. 29, 2001. The foregoing references are all incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. DABT-63-99-3-0003 awarded by Department of Advanced Research Projects Agency.

TECHNICAL FIELD

The present application is generally directed to nanoscale computing and memory circuits, and, more particularly, to the formation of wires for device applications, specifically, use of imprinting to form electrodes, devices, and circuits. By "nanoscale" is meant that either the vertical dimension or the electrical pathway between electrodes is measured in nanometers.

BACKGROUND ART

With the constantly decreasing feature sizes of integrated-circuit devices, well-behaved devices are becoming increasingly difficult to design. The fabrication is also becoming increasingly difficult and expensive. In addition, the number of electrons either accessed or utilized within a device is decreasing, with increasing statistical fluctuations in the electrical properties. In the limit, device operation depends on a single electron, and traditional device concepts must change.

Molecular electronics has the potential to augment or even replace conventional devices with electronic elements, can be altered by externally applied voltages, and have the potential to scale from micron-size dimensions to nanometer-scale dimensions with little change in the device concept. The molecular switching elements can be formed by inexpensive solution techniques; see, e.g., C. P. Collier et al, "Electronically Configurable Molecular-Based Logic Gates", *Science*, Vol. 285, pp. 391–394 (Jul. 16, 1999) and C. P. Collier et al, "A [2]Catenane-Based Solid State Electronically Reconfigurable Switch", *Science*, Vol. 289, pp. 1172–1175 (Aug. 18, 2000). The self-assembled switching elements may be integrated on top of a Si integrated circuit so that they can be driven by conventional Si electronics in the underlying substrate. To address the switching elements, interconnections or wires are used.

Molecular electronic devices, comprising crossed wire switches, hold promise for future electronic and computational devices. Thin single or multiple atomic layers can be formed, for example, by Langmuir-Blodgett techniques or self-assembled monolayer on a specific site. A very controlled roughness of the underlying surface is needed to allow optimal LB film formation. A crossed wire switch may comprise two wires, or electrodes, for example, with a molecular switching species between the two electrodes.

For nanoscale electronic circuits, it is necessary to invent new materials with the functions envisioned for them and new processes to fabricate them. Nanoscale molecules with special functions can be used as basic elements for nanoscale computing and memory applications.

As an example, imprinting techniques have been developed for nanometer-scale patterned thin films; see, e.g., S. Y. Chou et al, "Imprint Lithography with 25-Nanometer Resolution", *Science*, Vol. 272, pp. 85–87 (Apr. 5, 1996) and U.S. Pat. No. 5,772,905, entitled "Nanoimprint Technology", issued on Jun. 30, 1998, to S. Y. Chou, both of which are incorporated herein by reference.

Briefly, the imprinting method comprises compression molding and a pattern transfer process. In imprint lithography, a mold with nanometer-scale features is first pressed into a thin resist cast on a substrate, which creates a thickness contrast pattern in the resist. After the mold is removed, an anisotropic etching process is used to transfer the pattern into the entire resist thickness by removing the remaining resist in the compressed areas.

A need exists to incorporate the imprinting method in fabricating nanoscale circuits suitable for industrial fabrication processes.

DISCLOSURE OF INVENTION

In accordance with the present invention, a method of fabricating a molecular electronic device is provided. The molecular electronic device comprises at least one pair of crossed wires and a molecular switch film therebetween, wherein each pair of crossed wires and the molecular switch film form an electrochemical cell. The method comprises:

(a) forming at least one bottom electrode on a substrate by first forming a first layer on the substrate and patterning the first layer to form the bottom electrode by an imprinting technique;

(b) forming the molecular switch film on top of the bottom electrode;

(c) forming a protective layer on top of the molecular switch film to avoid damage thereto during further processing;

(d) coating a polymer layer on top of the protective layer and patterned the polymer layer by the imprinting method to form openings that expose portions of the protective layer; and (e) forming at least one top electrode on the protective layer through the openings in the polymer layer by first forming a second layer on the polymer layer and patterning the second layer.

The imprinting method, as employed herein, can be used to fabricate nanoscale patterns over a large area at high speeds acceptable in industrial standards. Consequently, it can be used to fabricate nanoscale molecular devices, e.g., crossbar memory circuits.

BEST MODES FOR CARRYING OUT THE INVENTION

Definitions

Figure 1A:
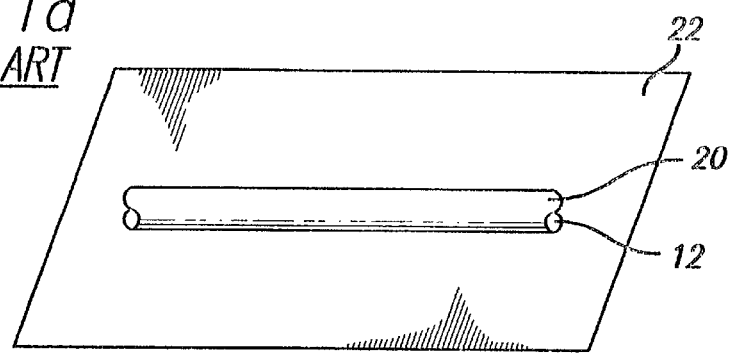
FIGS. 1a–1c are a schematic representation of the steps that use chemically fabricated (nanometer-scale diameter) wires to form a crossed wire switch.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some regular pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

"Micron-scale dimensions" refers to dimensions that range from 1 micrometer to a few micrometers in size.

"Sub-micron scale dimensions" refers to dimensions that range from 1 micrometer down to 0.05 micrometers.

"Nanometer scale dimensions" refers to dimensions that range from 0.1 nanometers to 50 nanometers (0.05 micrometers).

"Micron-scale wires" refers to rod or ribbon-shaped conductors or semiconductors with widths or diameters having the dimensions of 1 to 10 micrometers or larger, heights that can range from a few tens of nanometers to a few micrometers, and lengths of up to several micrometers or more.

"Nanometer-scale wires" refers to rod or ribbon-shaped conductors or semiconductors with widths or diameters having the dimension of 1 to 50 nanometers, heights that can range from 0.3 to 100 nm, and lengths of up to several micrometers or more.

Crossed Wire Switches

The description which follows is directed to the formation of micrometer scale and nanometer scale crossed wire switches, using a reduction-oxidation (redox) reaction to form an electrochemical cell. The molecular switches typically have two states, and may be either irreversibly switched from a first state to a second state or reversibly switched from a first state to a second state.

The crossed wire switch based on the redox reaction approach is disclosed and claimed in the above-identified patent application Ser. No. 09/280,048. Examples of molecules used in the redox reaction approach include rotaxanes, pseudo-rotaxanes, catenanes, and spiropyrans.

The crossed wire switch based on the E-field induced band gap change is disclosed and claimed in patent application Ser. No. 09/823,195, filed Mar. 29, 2001, which is incorporated herein by reference. Examples of molecules used in the E-field induced band gap change approach include molecules that evidence:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(2a) charge separation or recombination accompanied by increasing or decreasing band localization; or (2b) change of extended conjugation via charge separation or recombination and π-bond breaking or formation.

Figure 1B:
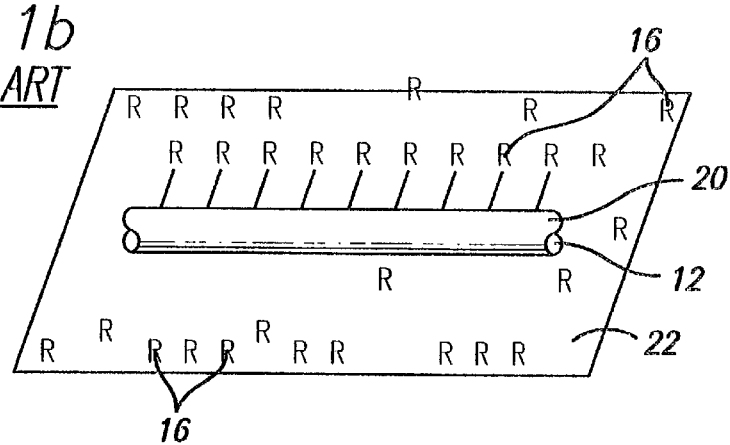
Figure 1C:
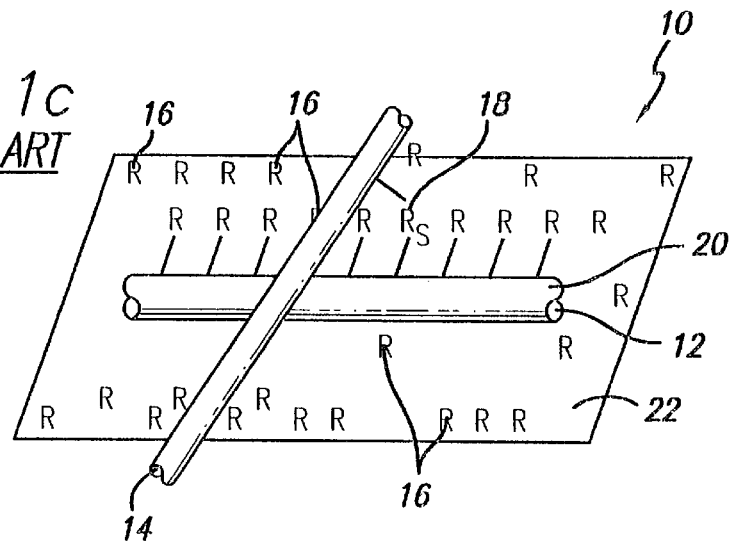

Although the description of FIGS. 1a–1c is presented in terms of the redox reaction approach, it will be readily apparent to those skilled in this art that the teachings of the present invention are equally applicable to the E-field induced band gap change approach.

The essential device features of a crossed wire switch 10 are shown in FIG. 1c. The crossed wire switch 10 comprises two wires, or electrodes, 12, 14, each either a metal or semiconductor wire, that are crossed at some non-zero angle. In between those wires is a layer of molecules or molecular compounds 16, denoted R in FIGS. 1b–1c. The particular molecules 18 (denoted $R_s$) that are sandwiched at the intersection of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Devices 10 (micrometer scale or nanometer scale) made from redox pairs may be prepared according to the method depicted in FIGS. 1a–c. In this case, a semiconductor (i.e., silicon) nanowire 12, possibly with an insulating surface layer 20 (for silicon, this is the naturally occurring $SiO_x$, where x=1–2) is deposited on a substrate 22, as illustrated in FIG. 1a. The substrate 22 is electrically insulating, and may comprise any of the substrate materials commonly employed in semiconductor fabrication, such as, but not limited to, undoped (i.e., intentionally not doped) semiconductor, silicon nitride, amorphous silicon dioxide (i.e., glass), crystalline silicon dioxide (i.e., quartz), sapphire, silicon carbide, diamond-like carbon (DLC), and the like, either in bulk form (the entire substrate) or in film form (film grown or deposited on a semiconductor substrate, such as silicon, gallium arsenide, etc.).

Second, a redox pair of molecules 16 (labeled R in FIG. 1b) is transferred as either a Langmuir-Blodgett film, or via some other form of deposition such as vacuum sublimation. The redox pair 16 can cover both the wire 12 and the substrate 22 or only the wire 12.

In the last step, either a metal or a semiconductor nanowire 14, possibly with an insulating layer (not shown), is deposited across the first wire 12. Only those redox pairs 18 that are sandwiched between the two wires 12, 14 are defined, or can function, as molecular switches 10, as illustrated in FIG. 1c.

In accordance with the present invention, the nanowire 12 is first formed as a layer on the substrate 22, and is subsequently patterned into individual electrodes, employing an imprinting technique, such as disclosed in the prior art references mentioned above. The imprinting method of the prior art can be used to fabricate nanoscale patterns over a large area at high speeds acceptable in industrial standards, and, as employed herein, it can be used to fabricate nanoscale molecular devices, e.g., crossbar memory circuits.

Briefly, the imprinting method comprises compression molding and a pattern transfer process. In imprint lithography, a mold with nanometer-scale features is first pressed into a thin resist cast on a substrate, which creates a thickness contrast pattern in the resist. After the mold is removed, an anisotropic etching process is used to transfer the pattern into the entire resist thickness by removing the remaining resist in the compressed areas. In the case of the bottom electrode 12, a thin resist, or polymer, (not shown) is formed on the surface of the bottom electrode, a desired pattern formed on a mold is pressed into the resist, and the pattern is transferred into the electrode, either by a lift-off process or by an etching process, both of which are well-known in resist technology. In both cases, after the imprinting process, the substrate in the polymer protrusion area will not be exposed.

In the lift-off process, the metal or semiconductor layer 12 is deposited vertically, such as by electron beam evaporation. In the next step, the polymer is dissolved in a suitable solvent. Only the metal that is directly in contact with the exposed substrate remains, which defines the wires (or patterns) in the exposed areas.

In the etching process, the metal or semiconductor layer 12 is deposited all over the substrate and the polymer is deposited on top of the metal or semiconductor layer. After the imprinting, the layer 12 exposed is etched away (usually by reactive ion etching or wet chemical etching, while the layer 12 protected by the polymer remains. After the etching, the polymer is dissolved in solvents, and the wires (or patterns) are defined in the unexposed areas.

Figure 2A:
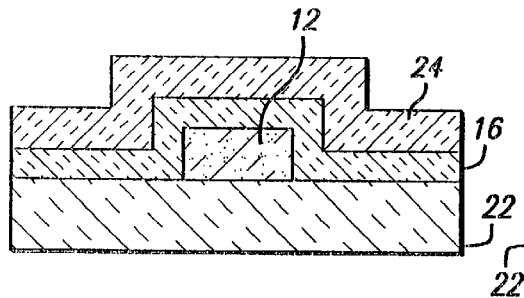
FIGS. 2a, 3a and 4a are cross-sectional views, depicting the process of the present invention.
Figure 2B:
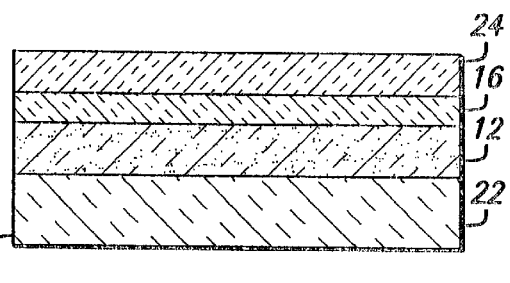
FIGS. 2b, 3b and 4b are also cross-sectional views, orthogonal to those of FIGS. 2a–4a, respectively.

Turning now to FIGS. 2–4, the bottom electrode 12 is fabricated by the imprinting method, using one of the two approaches described above. As shown in FIGS. 2a–2b, an electrode array, comprising a plurality of such electrodes 12, is thus formed on the substrate 22. The bottom electrode 12 can be a metal or semiconductor. Molecular thin films 16 are next deposited on the top of the electrodes 12 by a self-assembled method or Langmuir-Blodgett method. A protective layer 24 (metal or semiconductor) is deposited on the top of the molecular layer 16 to avoid damage to the molecular thin film during further processing. The protective layer is a metal or semiconductor.

Figure 3A:
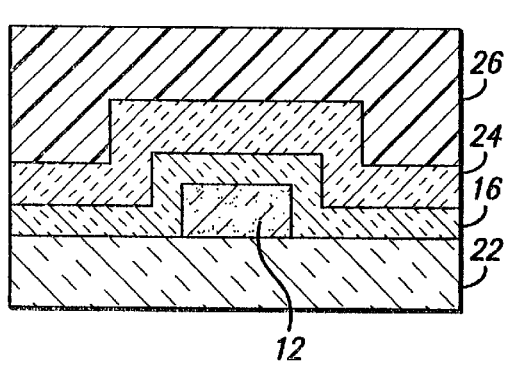
Figure 3B:
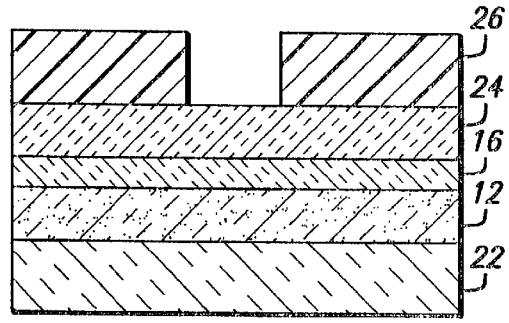

As shown in FIGS. 3a–3b, to fabricate top electrodes 14, a polymer layer 26 is coated on the top of the protective layer 24, and patterned, again, by the imprinting method briefly described above, using one of the two approaches. In this case, the protective layer 24 serves as the "substrate".

Figure 4A:
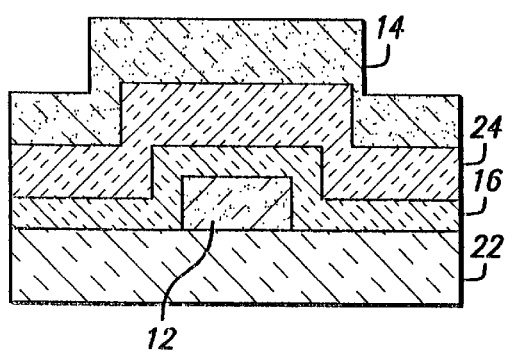
Figure 4B:
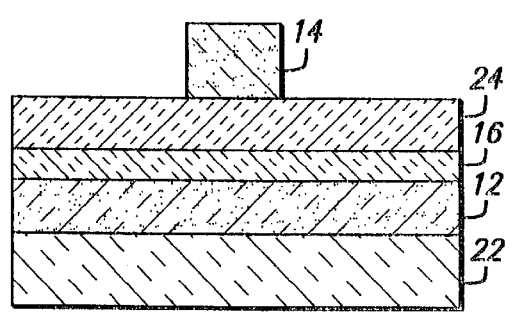

As shown in FIGS. 4a–4b, the second electrode 14 is then deposited and patterned by lift-off or etching method. The second electrode 14 can be metal or semiconductor. As seen in FIGS. 4a–4b, the top electrode 14 is orthogonal to the bottom electrode 12 (although the two electrodes 12, 14 may, in fact, be formed at any non-zero angle relative to each other).

Based on the foregoing teachings, it will be clear that the imprinting process employed herein can be used to fabricate complete molecular electronic circuits, including switches, crossbars, and circuits requiring even more complex steps than those described above. Specifically, the technology disclosed and claimed herein for forming crossed wires (micro-meter or nanometer) may be used to perform a variety of functions and to form a variety of useful devices and circuits for implementing computing on a microscale and even on a nanoscale. For example, applications include molecular wire crossbar interconnects (MWCI) for signal routing and communications, molecular wire crossbar memory (U.S. Pat. No. 6,128,214), molecular wire crossbar logic (MWCL) employing programmable logic arrays, a demultiplexer for a molecular wire crossbar network, molecular wire transistors, and pixel arrays for displays.

Figure 5:
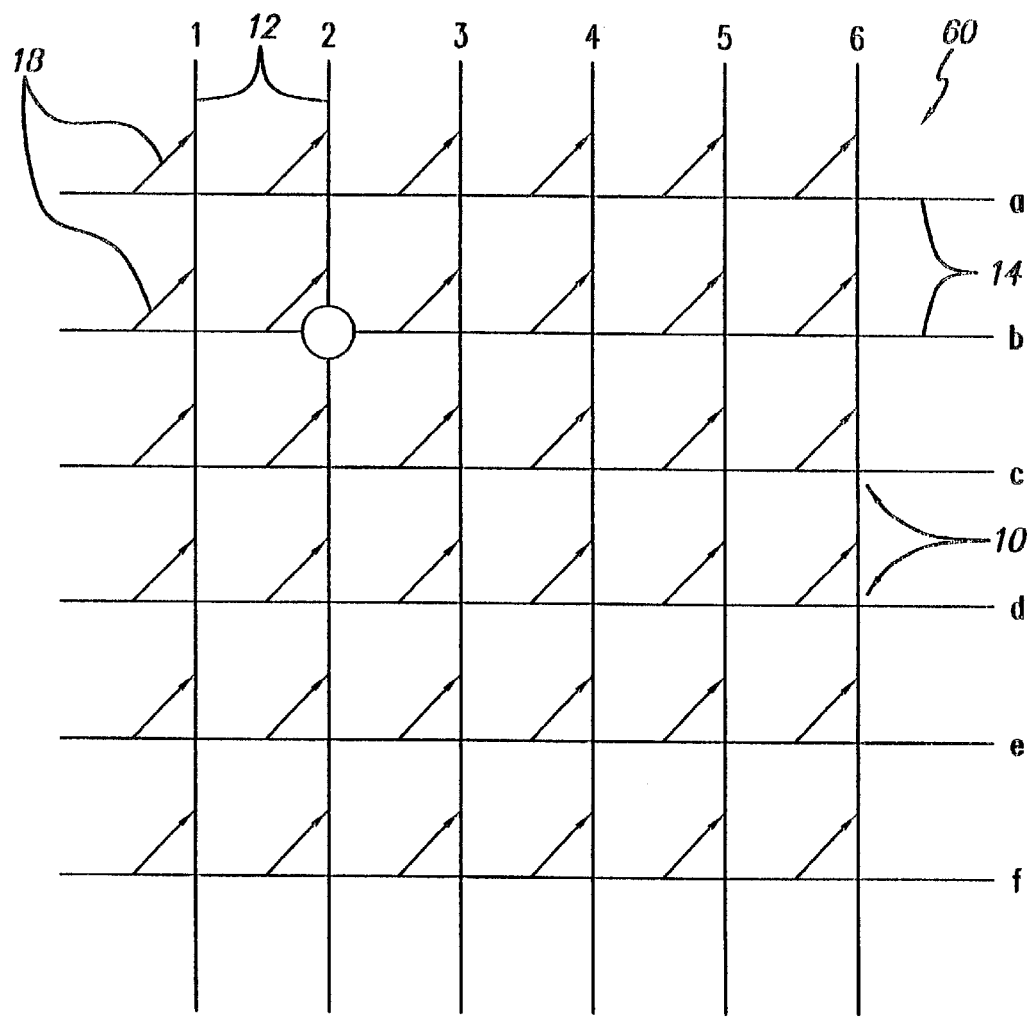
FIG. 5 is a schematic representation of a two-dimensional array of switches of the present invention, depicting a 6×6 crossbar switch.

As illustrated in FIG. 5, the switch 10 of the present invention can be replicated in a two-dimensional array to form a plurality, or array, 60 of switches to form a crossbar switch. FIG. 5 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those pre-selected junctions in accordance with the teachings herein. Details of the operation of the crossbar switch array 60 are further discussed in above-referenced U.S. Pat. No. 6,128,214.

Industrial Applicability

The method of employing imprinting for the fabrication of molecular electronic devices is expected to find use in nanoscale computing and memory circuits.

What is claimed is:

1. A method of fabricating a molecular electronic device comprising at least one pair of crossed wires and a molecular switch film therebetween, wherein said at least one pair of crossed wires and said molecular switch film form an electrochemical cell, said method comprising:

(a) forming at least one bottom electrode on a substrate by first forming a first layer on said substrate and patterning said first layer by an imprinting technique to form said bottom electrode;

(b) forming said molecular switch film on top of said bottom electrode;

(c) optionally forming a protective layer on top of said molecular switch film to avoid damage thereto during further processing;

(d) coating a polymer layer on top of said protective layer and patterning said polymer layer by said imprinting method to form openings that expose portions of said protective layer; and (e) forming at least one top electrode on said protective layer through said openings in said polymer layer by first forming a second layer on said polymer layer and patterning said second layer to form said top electrode.

2. The method of claim 1 wherein said imprinting technique comprises compression molding, followed by a pattern transfer process.

3. The method of claim 2 wherein a mold with nanometer-scale features is first pressed into a thin resist cast on a surface, which creates a thickness contrast pattern in said resist, the mold is removed, and an anisotropic etching process is used to transfer said pattern into the entire resist thickness by removing resist remaining in compressed areas.

4. The method of claim 1 wherein said bottom electrode comprises a metal or semiconductor.

5. The method of claim 1 wherein said molecular film is formed either by a self-assembled method or by the Langmuir-Blodgett method.

6. The method of claim 1 wherein said first layer and said second layer are independently patterned either by lift-off or by an etching method.

7. The method of claim 1 wherein said top electrode comprises a metal or semiconductor.

8. The method of claim 1 wherein said top electrode is formed at a non-zero angle with respect to said bottom electrode.

9. The method of claim 1 wherein said top electrode is formed substantially orthogonal to said bottom electrode.

10. A method of fabricating a crossbar molecular device comprising a plurality of pairs of crossed wires and a molecular switch film therebetween, wherein said at least one pair of crossed wires and said molecular switch film form an electrochemical cell, said method comprising:

(a) forming an array of bottom electrodes on a substrate by first forming a first layer on said substrate and patterning said first layer by an imprinting technique to form said array of bottom electrodes;

(b) forming said molecular switch film on top of array of said bottom electrodes;

(c) optionally forming a protective layer on top of said molecular switch film to avoid damage thereto during further processing;

(d) coating a polymer layer on top of said protective layer and patterning said polymer layer by said imprinting method to form a plurality of openings that expose portions of said protective layer; and (e) forming an array of top electrodes on said protective layer through said openings in said polymer layer by first forming a second layer on said polymer layer and patterning said second layer to form said array of top electrodes.

11. The method of claim 10 wherein said imprinting technique comprises compression molding, followed by a pattern transfer process.

12. The method of claim 11 wherein a mold with nanometer-scale features is first pressed into a thin resist cast on a surface, which creates a thickness contrast pattern in said resist, the mold is removed, and an anisotropic etching process is used to transfer said pattern into the entire resist thickness by removing resist remaining in compressed areas.

13. The method of claim 10 wherein said bottom electrode array comprises a metal or semiconductor.

14. The method of claim 10 wherein said molecular film is formed either by a self-assembled method or by the Langmuir-Blodgett method.

15. The method of claim 10 wherein said first layer and said second layer are independently patterned either by lift-off or by an etching method.

16. The method of claim 10 wherein said top electrode array comprises a metal or semiconductor.

17. The method of claim 10 wherein said array of said top electrodes is formed at a non-zero angle with respect to said array of said bottom electrodes.

18. The method of claim 10 wherein said array of said top electrodes is formed substantially orthogonal to said array of said bottom electrodes.

19. The method of claim 1 wherein said molecular switch film comprises molecules selected from the group consisting of rotaxanes, pseudo-rotaxanes, catenanes, and spiropyrans.

20. The method of claim 10 wherein said molecular switch film comprises molecules selected from the group consisting of rotaxanes, pseudo-rotaxanes, catenanes, and spiropyrans.

* * * * *